United States Patent
Cress et al.

(10) Patent No.: US 6,483,386 B1
(45) Date of Patent: Nov. 19, 2002

(54) LOW VOLTAGE DIFFERENTIAL AMPLIFIER WITH HIGH VOLTAGE PROTECTION

(75) Inventors: Daniel E. Cress, San Jose, CA (US); Jeffery Scott Hunt, Ackerman, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/676,539

(22) Filed: Sep. 29, 2000

(51) Int. Cl.$^7$ .................................................. H03F 1/52
(52) U.S. Cl. ........................................ 330/298; 327/309
(58) Field of Search ............................ 330/253; 4/298; 327/318, 328, 309

(56) References Cited

U.S. PATENT DOCUMENTS

| | | | |
|---|---|---|---|
| 4,096,402 A | * 6/1978 | Schroeder et al. | 327/77 |
| 4,178,558 A | * 12/1979 | Nagashima et al. | 330/11 |
| 4,264,872 A | * 4/1981 | Suzuki | 330/253 |
| 4,288,804 A | 9/1981 | Kikuchi et al. | 357/42 |
| 4,943,738 A | * 7/1990 | Hoshi | 327/87 |
| 5,349,305 A | * 9/1994 | Hsiao et al. | 330/253 |
| 5,412,348 A | * 5/1995 | Kasha et al. | 330/288 |
| 5,440,162 A | 8/1995 | Worley et al. | 257/355 |
| 5,732,015 A | * 3/1998 | Kazerpounian et al. | 365/154 |
| 5,850,365 A | 12/1998 | Reese et al. | 365/207 |
| 5,949,710 A | 9/1999 | Pass et al. | 365/185.05 |
| 6,175,952 B1 | 1/2001 | Patel et al. | 716/18 |
| 6,252,422 B1 | 6/2001 | Patel et al. | 326/80 |

* cited by examiner

*Primary Examiner*—Robert Pascal
*Assistant Examiner*—Khanh Van Nguyen
(74) *Attorney, Agent, or Firm*—Christopher P. Maiorana, P.C.

(57) ABSTRACT

An apparatus comprising a native device coupled to an input of an amplifier. The native device is configured to provide a high voltage protection in response to an enable signal.

20 Claims, 3 Drawing Sheets

US 6,483,386 B1

LOW VOLTAGE DIFFERENTIAL AMPLIFIER WITH HIGH VOLTAGE PROTECTION

FIELD OF THE INVENTION

The present invention relates to a method and/or architecture for implementing differential amplifiers generally and, more particularly, to a method and/or architecture for implementing a low voltage differential amplifier with high voltage protection.

BACKGROUND OF THE INVENTION

Integrated circuits (ICs) can be required to operate with secondary devices that can have a variety of supply voltages. If the IC is implemented using low voltage, thin oxide devices, but needs to operate with devices that use higher voltages, some sort of protection needs to be provided for the low voltage devices. FIG. 1 illustrates a conventional circuit 10 that uses thick oxide devices for high voltage protection. Such conventional approaches use high voltage devices HV1, HV2, HV3 and HV4 to implement an input differential amplifier.

Such an approach has the disadvantage of a reduced input common mode range due to a high threshold voltage Vt of the thick oxide devices HV1, HV2, HV3 and HV4. Also, such an approach requires a larger silicon area to implement and has slower performance. The high voltage devices HV1, HV2, HV3 and HV4 are larger, which impacts the size and the parasitic capacitance of the circuit 10.

FIG. 2 illustrates a conventional circuit 30 implementing high voltage complementary switches HV1 and HV2 (each comprising a p-channel and an n-channel device) to protect the input devices LV1 and LV2 of the low voltage input differential amplifier 32. The circuit 30 has the disadvantage of implementing a combination of high voltage thresholds and a low voltage gate bias, which causes an input voltage region in which signals can not be passed to the low voltage amplifier 32. This region is referred to as the dead zone, as shown in FIG. 3, where Vin is an input voltage. For example, if the n-channel device threshold voltage Vtn is 1.0V, the p-channel device threshold voltage Vtp is −1.0V, and the control voltages $LV_{13}$ $COMP_{13}$ EN and $LV_{13}$ $COMP_{13}$ ENb are 1.8V and 0.0V respectively, neither device of the complementary switches HV1 and HV2 will be turned on when the input level is between 0.8V and 1V. The dead zone region will be exaggerated as the control voltage $LV_{13}$ $COMP_{13}$ EN is reduced.

Both the circuit 10 and the circuit 30 do not meet the speed objective for the input paths of modern integrated circuits. Also, the circuit 30 fails to pass (or propagate) input levels residing within the dead zone, which is undesirable.

It would be desirable to implement a low voltage differential amplifier with high voltage protection that does not have a dead zone and does not sacrifice other performance specifications, such as speed, die size, input common mode range, etc.

SUMMARY OF THE INVENTION

The present invention concerns an apparatus comprising a native device coupled to an input of an amplifier. The native device is configured to provide high voltage protection in response to an enable signal.

The objects, features and advantages of the present invention include implementing a low voltage differential amplifier that may (i) implement fast signal propagation through the differential amplifier; (ii) implement a simple high voltage protection scheme without requiring a voltage pump or voltage reference circuit; (iii) avoid input level dead zone regions that may be associated with conventional approaches; and/or (iv) allow the differential amplifier to be implemented with low voltage devices, which may yield a wide input common mode range and lower parasitic capacitance.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 4:
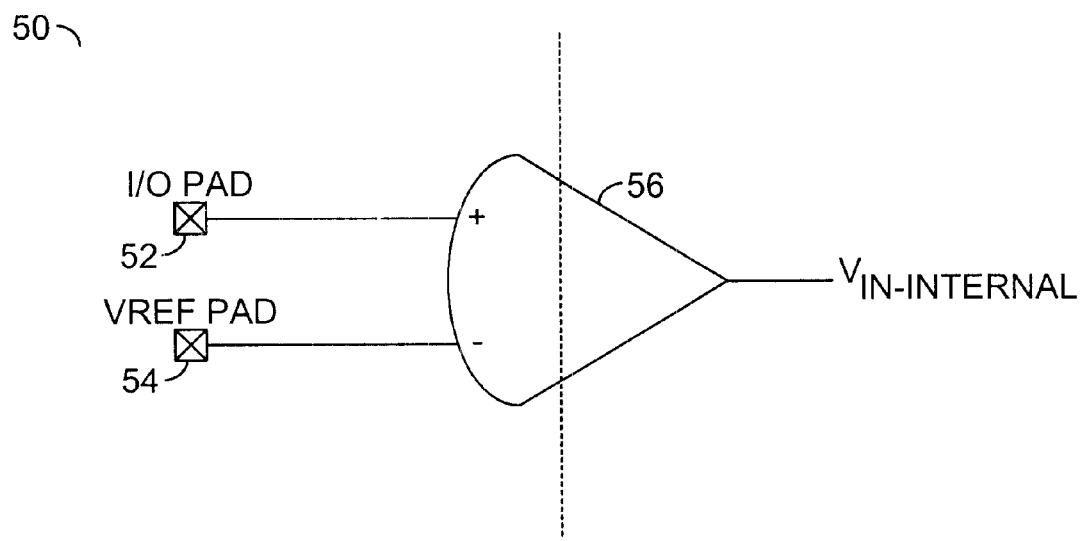
FIG. 4 is a block diagram of a preferred embodiment of the present invention.

Referring to FIG. 4, a block diagram of a circuit 50 is shown illustrating a context of a preferred embodiment of the present invention. The circuit 50 generally comprises an I/O pad 52, a voltage reference (VREF) pad 54 and an amplifier 56. A positive input of the amplifier 56 may receive a signal from the I/O pad 52. A negative input of the amplifier 56 may receive a signal from the VREF pad 54.

Figure 5:
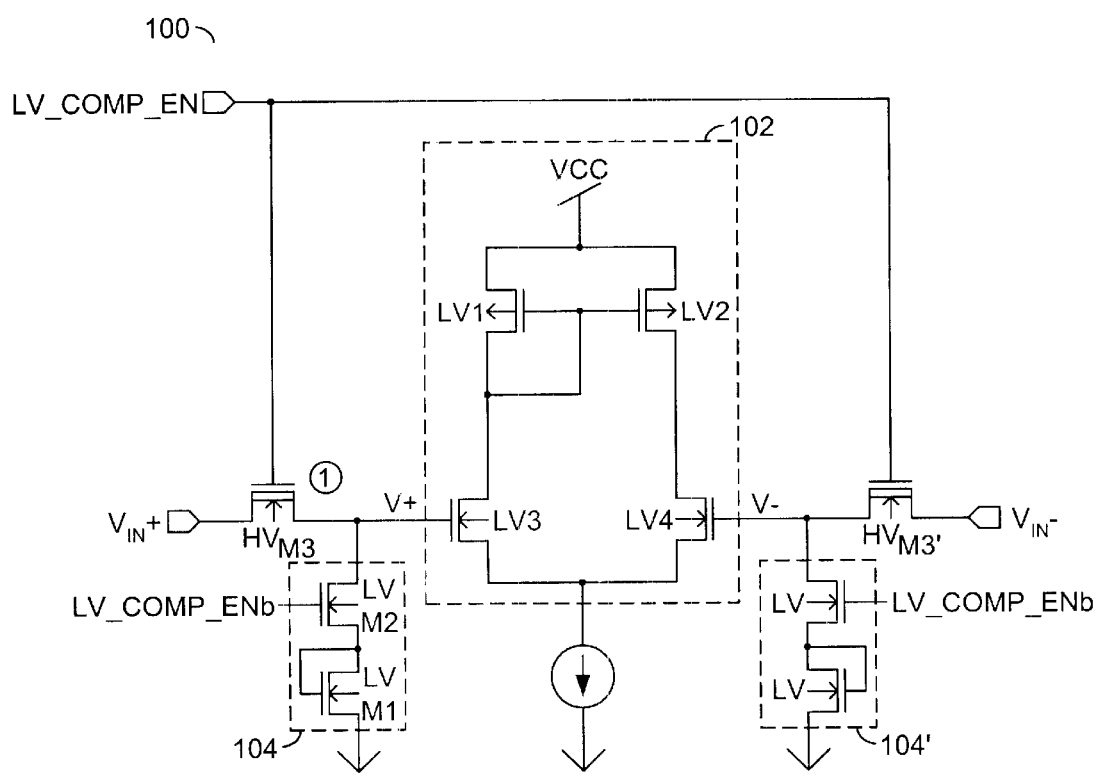
FIG. 5 is a diagram illustrating a preferred embodiment of the present invention.

Referring to FIG. 5, a block diagram of a circuit 100 is shown in accordance with a preferred embodiment of the present invention. The circuit 100 may be similar to the amplifier 56. The circuit 100 generally comprises an amplifier block (or circuit) 102, a protection device M3 and a clamp block (or circuit) 104. The clamp section 104 and the protection device M3 may be implemented between an input signal (e.g., VIN+) and an input (e.g., V+) of the amplifier circuit 102. The amplifier circuit 102 is shown implemented as a differential amplifier. However, the amplifier circuit 102 may be implemented as a single ended amplifier (not shown). A single ended amplifier would only have one input. If the amplifier circuit 102 is implemented as a differential amplifier, a clamp block (or circuit) 104' and a protection device M3' may be implemented between an input signal (e.g., VIN−) and an input (e.g., V−) of the amplifier circuit 102.

The circuit 100 uses, in one example, a high voltage n-channel native device (e.g., the protection device M3) with a gate connected to a signal $LV_{13}$ $COMP_{13}$ EN, whose high level is the internal regulator supply level. The low voltage devices within the differential amplifier 102 are protected since the native device M3 does not allow voltage levels higher than the regulated supply (VCC), which is a low voltage supply, to pass to the input of the differential amplifier 102. The circuit 100 may reliably pass all specified input levels required for low voltage input standards.

The clamp circuit 104 generally comprises a transistor M1 and a transistor M2. The amplifier section 102 generally comprises a number of devices LV1, LV2, LV3 and LV4. The devices LV1, LV2, LV3 and LV4 may be implemented as low voltage devices having a thin oxide. In general, the lower the operating voltage of a device, the thinner the oxide. If the differential input signals VIN+ and VIN+ are high voltage signals, they must be reduced in voltage before being presented to the amplifier circuit 102.

The circuit 100 provides protection to the low voltage differential inputs V+ and V− of the amplifier circuit 102. Such protection allows the amplifier circuit 102 to be implemented using thin oxide devices. The circuit 100 may allow input voltages VIN+ and VIN− that satisfy low voltage differential input standards (e.g., the low voltage input standards HSTL, GLT+, etc.) while protecting the low voltage differential amplifier 102 when the inputs VIN+ and VIN− are driven to higher voltages for high voltage standards.

Figure 1:
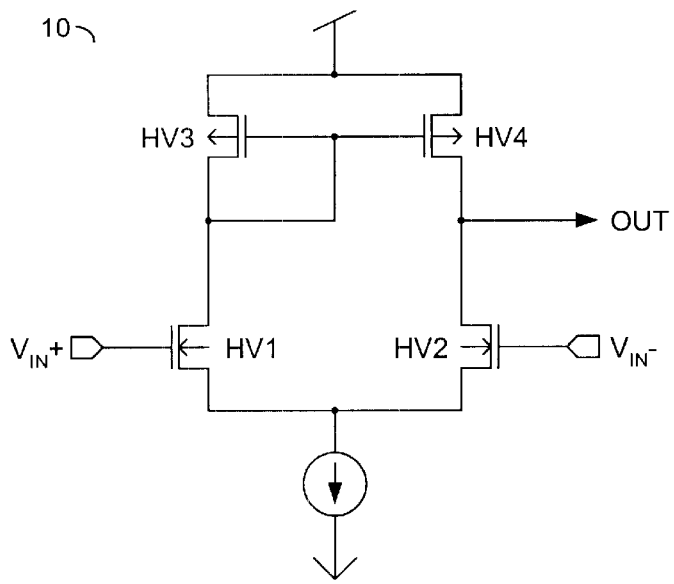
FIG. 1 is a diagram of a conventional differential amplifier using thick oxide devices.
Figure 2:
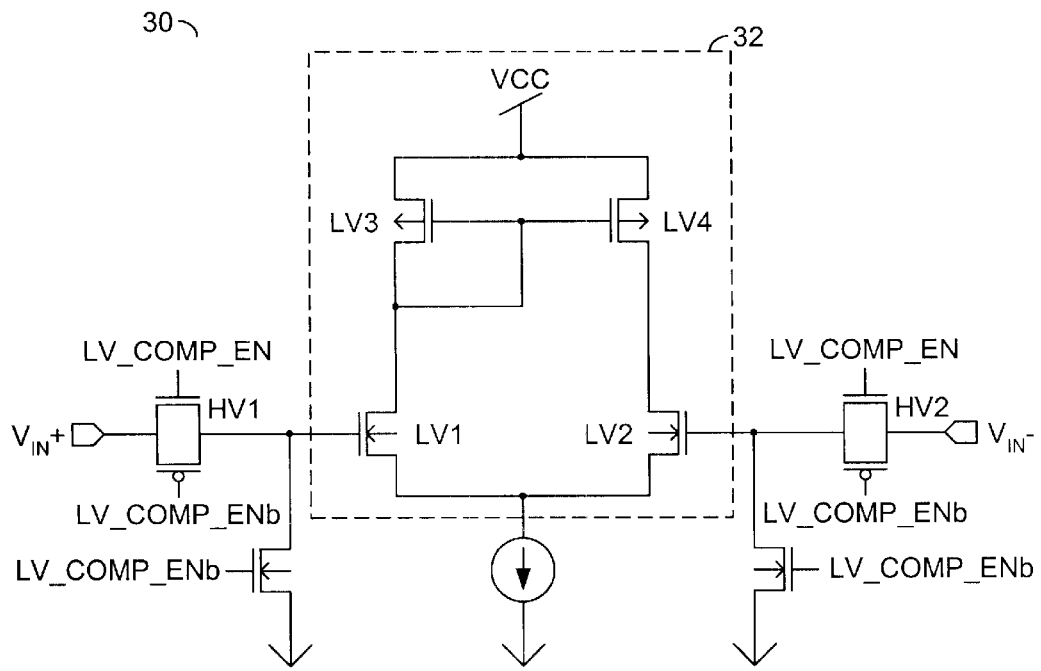
FIG. 2 is a diagram of a conventional differential amplifier using thin oxide devices with high voltage complementary switches connected to the amplifier inputs.
Figure 3:
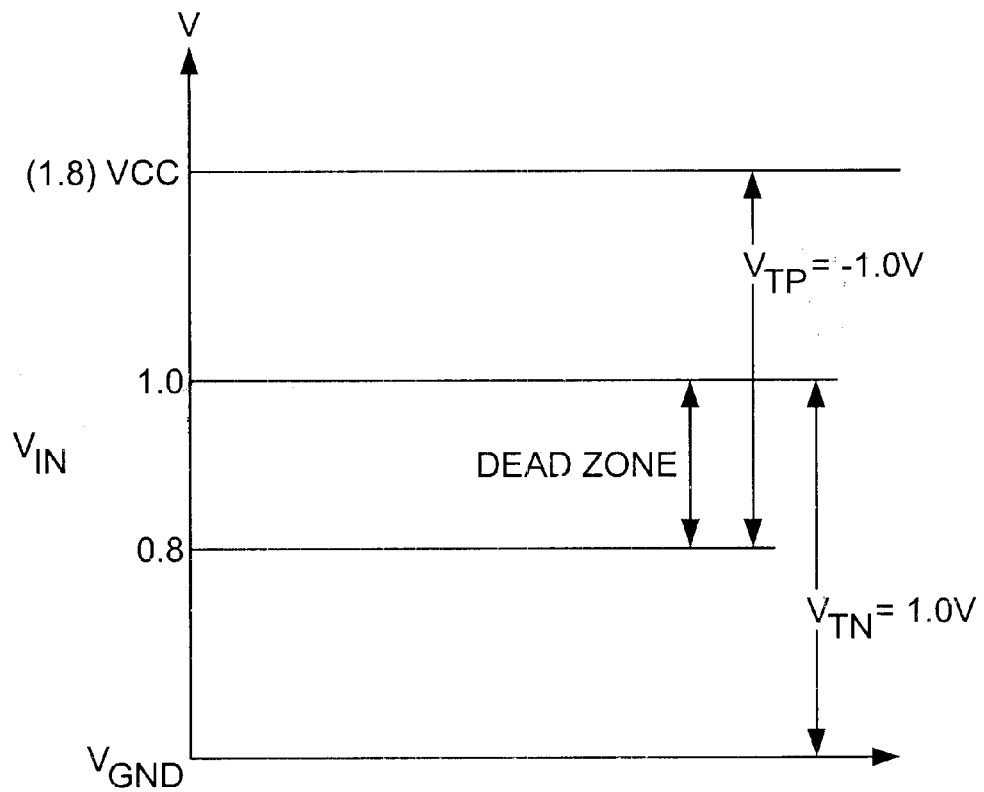
FIG. 3 is a diagram illustrating a dead zone created by the circuit of FIG. 2.

The device M3 may be implemented as an n-channel native device. A native device may be a device where the threshold voltage (e.g., Vt) may be zero, or near zero. While such native devices may be difficult to control (e.g., turn off) in certain applications, native devices can be used in the context of the present invention to provide voltage protection. By implementing the native device M3, the dead zone region of FIG. 3 is eliminated. However, high voltage protection is still provided since the gate of the native device M3 is controlled by a signal (e.g., LV_COMP_EN) whose high level does not exceed the internal regulated supply. In one example, the signal $LV_{13}$ $COMP_{13}$ EN may be implemented as an enable signal. A digital complement (e.g., $LV_{13}$ $COMP_{13}$ ENb) of the signal $LV_{13}$ $COMP_{13}$ EN may control the clamp 104.

The n-channel native device M3 may be implemented with a device threshold near (e.g., +/−200 mV) 0V to protect the input circuitry in the differential amplifier 102. The gate of the native device M3 is held low when the input is configured for high voltage operation (in which case a different input circuit is used to support a high voltage input standard). The gate of the device M3 is pulled high (e.g., to 1.8V for a 1.8V supply, 2.5V for a 2.5V supply, ect.) when the input is configured for the differential amplifier 102 is to be used for a low voltage input standard.

The transistor diode M1 of the clamp circuit 104 may be an optional device that may prevent current flow when the gate of the native device M3 is grounded. Without the transistor diode M1, a current path may exist when the threshold of the native device M3 is negative, since grounding the gate would not turn off the native device M3. In certain design applications, such an effect may be minimal and the transistor diode M1 may be eliminated. The transistor diode M1 may also prevent the gate of the differential amplifier 102 from either floating or coupling high enough to cause damage to the thin oxide devices LV3 and LV4. Again, in certain design applications, such an effect may be minimal and the transistor diode M1 may be eliminated. The circuit 100 generally provides high voltage protection, passes a wide range of input levels, and has speed and common mode range benefits from the low voltage differential amplifier 102.

The circuit 100 implements high voltage protection without using a voltage pump or similar voltage reference circuit and uses relatively little silicon area. The low voltage devices M1 and M2 are included to prevent a DC current path when the gate of the native device M3 is forced to ground and the native threshold is negative. The devices M1 and M2 may also protect the gate oxide of the low voltage devices LV3 and LV4 when the differential amplifier 102 is in a disabled state and the node voltage V+ attempts to float too high.

The circuit 100 may provide faster signal propagation through the differential amplifier 102 than the circuits discussed in the background section. In one example, the circuit 100 may implement a simple three device high voltage protection scheme (e.g., the devices M1, M2 and M3) without requiring a voltage pump or voltage reference circuit. The circuit 100 may be implemented without a dead zone region, therefore accommodating a wide range of input levels. The circuit 100 may allow the differential amplifier 102 to be implemented with low voltage devices LV1, LV2, LV3 and LV4, which may yield a wide input common mode range and lower parasitics.

The circuit 100 may protect thin oxide devices from damage when input signals are driven to high voltage levels. The circuit 100 may protect thin oxide devices from damage without distorting the input signal to the differential amplifier 102. The circuit 100 may protect thin oxide devices from damage without DC shifting the input signals to the differential amplifier 102. The circuit 100 may protect thin gate oxide devices from damage while not (significantly) slowing down the input to the amplifier 102.

Alternatively, the circuit 100 may be used with any input buffer design that requires high voltage protection (e.g., single ended or differential amplifiers). The invention provides a simple, non-analog method for protecting low voltage input circuits. The implementation of the native device M3 may provide a signal with low distortion. The diode connected low voltage device M1 may eliminate the DC current path that is normally a major concern when designing with device thresholds that can be either positive or negative.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising a first native device coupled to an input of an amplifier, wherein said first native device is configured to (i) provide voltage protection in response to an enable signal and avoid dead zone regions for a range of input levels.

2. The apparatus according to claim 1, wherein said amplifier comprises:
   one or more low voltage devices that yield a wide input common mode range and lower parasitic capacitance.

3. The apparatus according to claim 1, wherein said amplifier comprises a differential amplifier.

4. The apparatus according to claim 1, wherein said apparatus further comprises a clamp circuit coupled to said input of said amplifier.

5. The apparatus according to claim 3, wherein said apparatus further comprises a second native device connected to a second input of said differential amplifier.

6. The apparatus according to claim 3, wherein said apparatus further comprises:
   a second native device;
   a first clamp circuit; and
   a second clamp circuit, wherein said first native device and said first clamp circuit are coupled to a first input of said differential amplifier and said second native device and said second clamp device are coupled to a second input of said differential amplifier.

7. The apparatus according to claim 6, wherein said first and second native devices are configured in response to one or more enable signals.

8. The apparatus according to claim 1, wherein said first native device has a voltage threshold of zero or near zero.

9. The apparatus of claim 1, wherein the voltage threshold of said first native device is near 0V.

10. The apparatus of claim 4, wherein said clamp is configured to provide high voltage protection.

11. The apparatus of claim 10, wherein said clamp comprises a transistor diode configured to prevent current flow into said amplifier when said native device is in a grounded state.

12. A method for protecting one or more thin oxide devices of an amplifier, comprising the steps of:

(A) receiving one or more input signals; and (B) protecting the one or more thin oxide devices (i) with a native device when said one or more input signals are driven to voltage levels above an allowable voltage level of the one or more thin oxide devices and (ii) without distorting the one or more input signals.

13. The method according to claim 12, wherein step (B) further comprises:

protecting said one or more thin oxide devices without DC shifting the one or more input signals to the amplifier.

14. The method according to claim 12, wherein said amplifier comprises a differential amplifier.

15. The method according to claim 12, wherein step (B) further comprises:

protecting said one or more thin oxide devices without adding dead zone regions.

16. The method of claim 12, wherein the voltage threshold of said native device is near 0V.

17. The method of claim 12, wherein said native device is controlled by an enable signal with a high level that does not exceed an internal regulated supply.

18. An apparatus for protecting one or more thin oxide devices of an amplifier, comprising:

means for receiving one or more input signals; and means for protecting said one or more thin oxide devices with a native device when said one or more input signals are driven to voltage levels higher than an allowable voltage level of the one or more thin oxide devices of one or more transistors in said amplifier.

19. The apparatus according to claim 18, wherein said transistors of said amplifier comprise low voltage thin oxide devices.

20. An apparatus comprising (i) a first native device coupled to an input of an amplifier and (ii) a clamp circuit coupled to said input of said amplifier, wherein said first native device is configured to provide voltage protection in response to an enable signal.

* * * * *